US012560970B2

(12) United States Patent
Liang et al.

(10) Patent No.: US 12,560,970 B2
(45) Date of Patent: Feb. 24, 2026

(54) FLEXIBLE SCREEN COVER, FLEXIBLE DISPLAY PANEL, FLEXIBLE SCREEN, AND COLLAPSIBLE ELECTRONIC DEVICE

(71) Applicant: Huawei Technologies Co., Ltd., Shenzhen (CN)

(72) Inventors: Xiao Liang, Shenzhen (CN); Jie Wang, Dongguan (CN); Fangcheng Liu, Shenzhen (CN); Fuguo Xu, Dongguan (CN); Miao Zheng, Shenzhen (CN); Qichun Gong, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 344 days.

(21) Appl. No.: 17/799,499

(22) PCT Filed: Dec. 10, 2020

(86) PCT No.: PCT/CN2020/135067
§ 371 (c)(1),
(2) Date: Aug. 12, 2022

(87) PCT Pub. No.: WO2021/159837
PCT Pub. Date: Aug. 19, 2021

(65) Prior Publication Data
US 2023/0341904 A1      Oct. 26, 2023

(30) Foreign Application Priority Data
Feb. 14, 2020     (CN) .......................... 202010093247.8

(51) Int. Cl.
G06F 1/16           (2006.01)
H04M 1/02          (2006.01)
(Continued)

(52) U.S. Cl.
CPC .......... G06F 1/1656 (2013.01); G06F 1/1652 (2013.01); H04M 1/0268 (2013.01);
(Continued)

(58) Field of Classification Search
None
See application file for complete search history.

(56) References Cited

U.S. PATENT DOCUMENTS 9,921,349 B2 *   3/2018   Choi ................. G02F 1/133502
2011/0273383 A1   11/2011   Jeon et al.
(Continued)

FOREIGN PATENT DOCUMENTS

CN          103889714 A      6/2014
CN          105517796 A      4/2016
(Continued)

*Primary Examiner* — Allen L Parker
*Assistant Examiner* — Christopher L Augustin
(74) *Attorney, Agent, or Firm* — SLATER MATSIL, LLP

(57) ABSTRACT

This application provides a flexible screen cover. The flexible screen cover includes a protective layer, a main layer, and a buffer layer. A modulus ratio of the main layer to the buffer layer is 8 to 180000. The buffer layer can be disposed at any proper position in the flexible screen. A modulus ratio of an adjacent layer to a buffer layer is 2 to 500000. The collapsible electronic device includes a housing and a flexible screen, and the flexible screen is installed in the housing. This application can improve impact resistance performance of the flexible screen.

19 Claims, 8 Drawing Sheets

10

14

13     12     11

(51) Int. Cl.
   H10K 59/80          (2023.01)
   H10K 102/00         (2023.01)

(52) U.S. Cl.
   CPC .........  H10K 59/87 (2023.02); H10K 59/8793 (2023.02); *H10K 2102/311* (2023.02)

(56)                References Cited

U.S. PATENT DOCUMENTS

| | | | |
|---|---|---|---|
| 2015/0210588 A1 | 7/2015 | Chang et al. | |
| 2015/0310776 A1 | 10/2015 | Lee et al. | |
| 2016/0324013 A1 | 11/2016 | Lee et al. | |
| 2018/0061893 A1 | 3/2018 | Breedlove et al. | |
| 2018/0134007 A1* | 5/2018 | Lee | B32B 25/20 |
| 2018/0219181 A1* | 8/2018 | Son | H10K 59/8791 |
| 2018/0315953 A1 | 11/2018 | Hu et al. | |
| 2019/0047900 A1* | 2/2019 | Hu | C03C 17/28 |
| 2019/0250317 A1* | 8/2019 | Choi | G02B 5/3016 |
| 2019/0278411 A1 | 9/2019 | Jeon et al. | |
| 2019/0346591 A1* | 11/2019 | Thothadri | H05K 5/03 |

FOREIGN PATENT DOCUMENTS

| | | | |
|---|---|---|---|
| CN | 106298838 A | 1/2017 |
| CN | 206400960 U | 8/2017 |
| CN | 107123380 A | 9/2017 |
| CN | 107633775 A | 1/2018 |
| CN | 107867030 A | 4/2018 |
| CN | 108099282 A | 6/2018 |
| CN | 108351547 A | 7/2018 |
| CN | 108877529 A | 11/2018 |
| CN | 208284171 U | 12/2018 |
| CN | 109285452 A | 1/2019 |
| CN | 109564985 A | 4/2019 |
| CN | 109747235 A | 5/2019 |
| CN | 109896753 A | 6/2019 |
| CN | 110014707 A | 7/2019 |
| CN | 209328005 U | 8/2019 |
| CN | 110473471 A | 11/2019 |
| CN | 110647213 A | 1/2020 |
| JP | 2018067709 A | 4/2018 |
| WO | WO-2019013366 A1 * | 1/2019 |

* cited by examiner

10

10

14

14

16

16

16

14

14

14

FLEXIBLE SCREEN COVER, FLEXIBLE DISPLAY PANEL, FLEXIBLE SCREEN, AND COLLAPSIBLE ELECTRONIC DEVICE

CROSS-REFERENCE TO RELATED APPLICATIONS

This application is a national stage of International Application No. PCT/CN2020/135067, filed on Dec. 10, 2020, which claims priority to Chinese Patent Application No. 202010093247.8, filed on Feb. 14, 2020. Both of the aforementioned applications are hereby incorporated by reference in their entireties.

TECHNICAL FIELD

This application relates to the field of display technologies, and in particular, to a flexible screen cover, a flexible display panel, a flexible screen, and a collapsible electronic device.

BACKGROUND

A collapsible flexible screen overturns an impression of people on a conventional mobile phone screen. The flexible screen uses a flexible organic polymer material, and strength of the flexible screen is far less than that of the conventional mobile phone screen. Consequently, impact resistance performance of the flexible screen is relatively poor.

SUMMARY

This application provides a flexible screen cover, a flexible display panel, a flexible screen, and a collapsible electronic device, to improve impact resistance performance of the flexible screen.

According to a first aspect, this application provides a flexible screen cover. The flexible screen cover is configured to cover a flexible display panel, to protect the flexible display panel and provide an interface for touching by a user. The flexible screen cover has flexible and bendable performance, and includes a protective layer, a main layer, and a buffer layer that are sequentially stacked. A modulus ratio of the main layer to the buffer layer is 8 to 180000. The protective layer is configured to protect the main layer to improve reliability of the main layer. The protective layer may be made of a flexible and bending-resistant organic polymer material. The main layer may be made of a high-modulus material, and the main layer has a relatively strong deformation resistance capability. The buffer layer may be made of a low-modulus translucent material, and the buffer layer is close to the flexible display panel.

The flexible screen cover is subjected to transient impact, and a mechanical scenario of the flexible screen cover may be analyzed by using a stress wave theory in dynamic mechanics. According to the stress wave theory, a material modulus ratio of the main layer to the buffer layer is 8 to 180000 (including the endpoint values). In other words, a modulus of the main layer is far greater than a modulus of the buffer layer, and a wave impedance difference between the main layer and the buffer layer is quite large. In addition, deformation of the buffer layer falls within a proper range and is not excessive, so that a relatively stable interface can be maintained between the buffer layer and the main layer. Therefore, a stress wave generated by the transient impact can be adequately reflected in the interface between the main layer and the buffer layer, so that much energy is taken away by a reflected stress wave, and a transmitted stress wave enters the buffer layer with less energy. Therefore, the flexible display panel also receives less impact energy. This can effectively reduce impact on the flexible display panel and effectively reduce a risk of damage to the flexible display panel. Therefore, disposing the buffer layer on one side of the main layer and ensuring that the modulus ratio of the main layer to the buffer layer falls within the proper range of 8 to 180000 can improve an impact resistance capability of a flexible screen.

In an implementation, the buffer layer is in direct contact with the main layer. Direct contact means that the two are directly laminated without being connected by using an additional adhesive. For example, the buffer layer may be formed on a surface of the main layer through a coating process such as spraying or screen printing, or attachment of the buffer layer to the main layer may be implemented in a manner of first laminating and then curing. Direct contact can reduce strain of the main layer under impact, avoid damage to the main layer that is caused by excessive deformation, improve reliability of the flexible screen cover, and improve impact resistance performance of the flexible screen.

In an implementation, an elongation rate at break of the buffer layer to the main layer is greater than or equal to 2. When the main layer is impacted, the buffer layer can provide resistance to the main layer to resist deformation of the main layer, thereby reducing a risk of damage to the main layer and improving impact resistance performance of the flexible screen cover and the entire flexible screen.

In an implementation, the main layer is made of ultra-thin glass, the flexible screen cover includes a reinforcing layer, the reinforcing layer and the main layer are stacked between the protective layer and the main layer, and a modulus of the reinforcing layer is greater than or equal to 1 MPa. The reinforcing layer may be made of, for example, a polymer material such as an acrylate, a polyurethane, a polyester, a polyimide, or an epoxy resin. Disposing the reinforcing layer can improve strength of the main layer made of the ultra-thin glass and reduce a breakage risk of the main layer, so that impact resistance performance of the flexible screen cover and the entire flexible screen can be improved.

In an implementation, the reinforcing layer is in direct contact with the main layer, in other words, the reinforcing layer and the main layer are not bonded by using an additionally disposed adhesive, but are directly laminated. For example, the reinforcing layer may be directly formed on the surface of the main layer through a coating process; or the reinforcing layer is an adhesive film for directly pasting the reinforcing layer and the main layer. It is verified through an impact resistance test that the direct contact manner has an optimal effect of protecting the main layer, making a breakage risk of the main layer the lowest.

In an implementation, the main layer is made of a colorless polyimide, and the modulus ratio of the main layer to the buffer layer is 8 to 16000. Because the colorless polyimide has relatively good toughness, and an elongation at break of the colorless polyimide can reach 15% to 40%, the main layer made of the colorless polyimide can be well adapted to a bending scenario. In addition, setting the modulus ratio of such a main layer to the buffer layer to 8 to 16000 can improve an impact resistance capability of the flexible screen with such a main layer.

In an implementation, the buffer layer is made of a polyurethane elastomer, an acrylate elastomer, or a polysiloxane elastomer. These materials are mature and have reliable performance, so that an energy reflection interface can be well formed between these materials and the main layer.

In an implementation, the protective layer includes a first protective layer and a second protective layer that are stacked, the second protective layer is located between the first protective layer and the main layer, and a modulus of the first protective layer is at a GPa level. For example, the first protective layer may be made of an organic polymer material such as an aramid, a colorless polyimide, or a polyethylene terephthalate. The second protective layer may use a colorless polyimide. The modulus of the first protective layer may be greater than or equal to a modulus of the second protective layer. Disposing the two protective layers can increase a protection thickness of the flexible screen cover, and using a material with a higher modulus to manufacture the outer first protective layer can improve a deformation resistance capability of the flexible screen cover. Generally, this design improves impact resistance performance of the flexible screen cover and the flexible screen.

In an implementation, a hardening layer may be formed, through a hardening process, on a surface of the first protective layer that is away from the second protective layer. Disposing the hardening layer can improve abrasion resistance and hardness of the first protective layer and improve touch feedback of the user.

According to a second aspect, this application provides a flexible display panel. The flexible display panel includes a first buffer layer, a polarizer, a second buffer layer, and a display layer that are sequentially stacked, the polarizer is located on a light emitting side of the display layer, a modulus ratio of the polarizer to the first buffer layer is 4 to 10000, and a modulus ratio of the polarizer to the second buffer layer is 4 to 10000. The flexible display panel may be used together with a flexible screen cover, and the flexible display panel may be an OLED display panel. A material type and a parameter value of each of the first buffer layer and the second buffer layer may be the same as a material type and a parameter value of the foregoing buffer layer. The display layer includes an OLED component, and the display layer can emit light under an electric field to implement display.

According to a stress wave theory, because wave impedance differences between the polarizer and the first buffer layer and the second buffer layer on both sides of the polarizer are relatively large and fall within a proper range, energy of a stress wave attenuated in an interface between a main layer and the first buffer layer is attenuated in an interface between the first buffer layer and the polarizer and is further attenuated in an interface between the polarizer and the second buffer layer, so that energy that finally enters the display layer is greatly reduced, thereby effectively reducing a risk of damage to the display layer and avoiding abnormal display, in other words, improving impact resistance capabilities of the flexible display panel and a flexible screen.

In an implementation, the polarizer is in direct contact with the second buffer layer. Direct contact means that the two are directly laminated without being connected by using an additional adhesive. For example, the buffer layer may be formed on a surface of the polarizer through a coating process such as spraying or screen printing, or attachment of the buffer layer to the polarizer may be implemented in a manner of first laminating and then curing. Direct contact can reduce strain of the polarizer under impact and avoid damage to the polarizer that is caused by excessive deformation.

In an implementation, the first buffer layer is made of a polyurethane elastomer, an acrylate elastomer, or a polysiloxane elastomer, and/or the second buffer layer is made of a polyurethane elastomer, an acrylate elastomer, or a polysiloxane elastomer. Materials of the first buffer layer and the second buffer layer may be the same or different. The materials are mature and have reliable performance, so that an energy reflection interface can be well formed between the materials and the polarizer.

In an implementation, the flexible display panel includes a third buffer layer and a support layer, where the third buffer layer, the support layer, and the display layer are stacked and are all located on a backlight side of the display layer, and a modulus ratio of the support layer to the third buffer layer is 2 to 500000. The third buffer layer may be made of a low-modulus material, and the third buffer layer may be translucent or non-translucent. The support layer is used as a back support and protection structure of the entire flexible display panel. The support layer may be made of a metal material such as a titanium alloy, stainless steel, copper foil, or a magnesium aluminum alloy, or a high-modulus organic material such as a colorless polyimide, an aramid, or a polyethylene terephthalate. There may be one third buffer layer and one support layer. In this case, one of the two is close to the display layer, and the other is far away from the display layer.

According to the stress wave theory, because an interface between the support layer and the third buffer layer is formed between a high-modulus material and a low-modulus material, energy of a stress wave from a back surface of the flexible display panel can be attenuated, so that energy that finally enters the display layer is reduced, thereby reducing impact on the display layer and effectively alleviating impact on the back surface of the flexible display panel.

In an implementation, there is at least one support layer, there are at least two third buffer layers, the at least one support layer and the at least two third buffer layers are alternately stacked, one of the third buffer layers is adjacent to the display layer, and the display layer and all support layers are respectively located on two opposite sides of the third buffer layer adjacent to the display layer. In other words, starting from the display layer, the flexible display panel is in a structure form of the display layer, a third buffer layer, a support layer, a third buffer layer, and the like. Based on an actual quantity of third buffer layers and an actual quantity of support layers, a layer farthest from the display layer may be a third buffer layer or a support layer, and a layer close to the backlight side of the display layer is one of the third buffer layers. An interface formed between a high-modulus material and a low-modulus material can increase attenuation of stress wave energy, thereby further reducing impact on the display layer and greatly alleviating impact on the back surface of the flexible display panel.

In an implementation, the third buffer layer is made of a polyurethane elastomer, an acrylate elastomer, a polysiloxane elastomer, an acrylate foam, a polyurethane foam, a polystyrene material, a polyethylene material, an ethylene propylene terpolymer material, or an ethylene vinyl acetate copolymer material. The materials are mature and have reliable performance, and can well participate in formation of an energy reflection interface.

According to a third aspect, this application provides a flexible screen. The flexible screen includes a protective layer, a main layer, a polarizer, a display layer, and a support layer that are sequentially stacked, the polarizer is located on a light emitting side of the display layer, and the support layer is located on a backlight side of the display layer. The flexible screen further includes at least one of a first buffer layer, a second buffer layer, and a third buffer layer, to be specific, includes only the first buffer layer, the second buffer layer, or the third buffer layer, or includes the first buffer layer and the second buffer layer, or includes the first buffer layer and the third buffer layer, or includes the second buffer layer and the third buffer layer, or includes the first buffer layer, the second buffer layer, and the third buffer layer. In the solution in which the first buffer layer is included, the first buffer layer is located between the main layer and the polarizer, and both a modulus ratio of the main layer to the first buffer layer and a modulus ratio of the polarizer to the first buffer layer are 2 to 500000. In the solution in which the second buffer layer is included, the second buffer layer is located between the polarizer and the display layer, and both a modulus ratio of the polarizer to the second buffer layer and a modulus ratio of the display layer to the second buffer layer are 2 to 500000. In the solution in which the third buffer layer is included, the third buffer layer is located on the backlight side of the display layer, the third buffer layer and the support layer are stacked, and a modulus ratio of the support layer to the third buffer layer is 2 to 500000.

Disposing a buffer layer at any proper position in the flexible screen and enabling a modulus ratio of an adjacent layer (a layer adjacent to the buffer layer, including the display layer and excluding an adhesive layer) to the buffer layer to fall within the proper range of 2 to 500000 can construct a stable interface between a high-modulus material and a low-modulus material, thereby improving impact resistance performance of the flexible screen.

In an implementation, when the flexible screen includes the first buffer layer or the second buffer layer, the first buffer layer is made of a polyurethane elastomer, an acrylate elastomer, or a polysiloxane elastomer, and the second buffer layer is made of a polyurethane elastomer, an acrylate elastomer, or a polysiloxane elastomer. When the flexible screen includes the third buffer layer, the third buffer layer is made of a polyurethane elastomer, an acrylate elastomer, a polysiloxane elastomer, an acrylate foam, a polyurethane foam, a polystyrene material, a polyethylene material, an ethylene propylene terpolymer material, or an ethylene vinyl acetate copolymer material. In this implementation, that the flexible screen includes the first buffer layer means that the first buffer layer is disposed between the main layer and the polarizer. Similarly, that the flexible screen includes the second buffer layer means that the second buffer layer is disposed between the polarizer and the display layer, and that the flexible screen includes the third buffer layer means that the third buffer layer is disposed on the backlight side of the display layer. The first buffer layer, the second buffer layer, and the third buffer layer that are manufactured by using the corresponding materials have reliable performance, so that an energy reflection interface can be well formed.

According to a fourth aspect, this application provides a collapsible electronic device. The collapsible electronic device includes a housing and a flexible screen, and the flexible screen is installed in the housing. The housing may be used as an external part or a non-external part of the collapsible electronic device. The housing may be folded and expanded. When the housing is folded, the flexible screen may be housed in the housing, in other words, the collapsible electronic device is an electronic device with a screen folded inward; or when the housing is folded, the flexible screen is located outside the housing, in other words, the collapsible electronic device is an electronic device with a screen folded outward. The flexible screen of the collapsible electronic device has better impact resistance performance.

DETAILED DESCRIPTION OF ILLUSTRATIVE EMBODIMENTS

Figure 1:
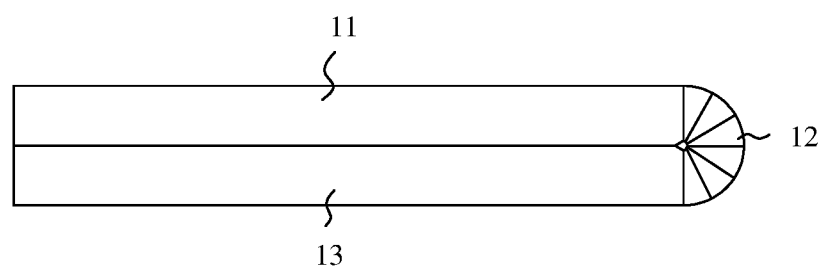
FIG. 1 is a schematic diagram of a side view structure of a collapsible electronic device in a folded state according to Embodiment 1.
Figure 2:
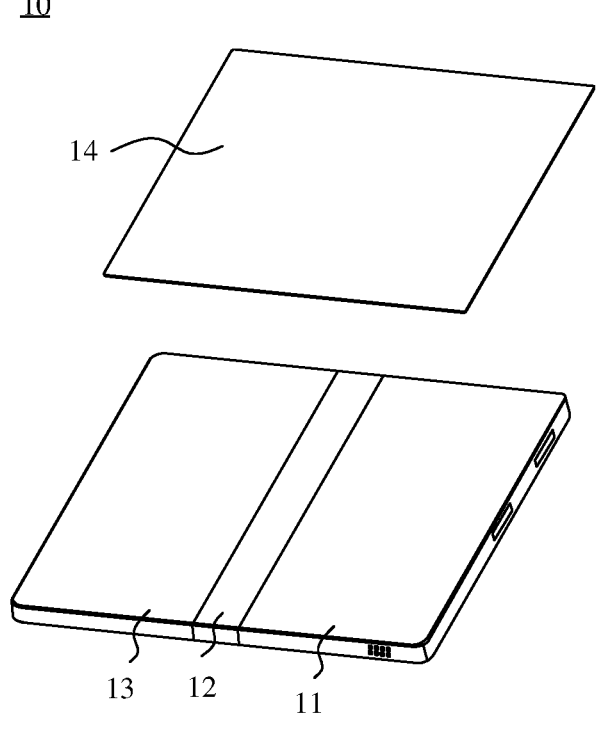
FIG. 2 is a schematic diagram of an exploded structure of the collapsible electronic device in FIG. 1 in an expanded state.

The following embodiments of this application provide a collapsible electronic device, including but not limited to a collapsible mobile phone, a collapsible tablet computer, and the like. As shown in FIG. 1 and FIG. 2, the collapsible electronic device 10 includes a first housing 11, a hinge 12, a second housing 13, and a flexible screen 14.

As shown in FIG. 1, the hinge 12 is disposed between the first housing 11 and the second housing 13. The hinge 12 may be a mechanism including several components, and the hinge 12 can generate a mechanism movement. Two opposite sides of the hinge 12 are respectively connected to the first housing 11 and the second housing 13, so that the first housing 11 and the second housing 13 rotate relative to each other.

In Embodiment 1, both the first housing 11 and the second housing 13 may be used as external parts of the collapsible electronic device 10, that is, exposed parts that can be directly observed by a user. In another embodiment, the collapsible electronic device 10 may include a housing used as an external part, and both the first housing 11 and the second housing 13 may be installed in the housing as non-external parts. The first housing 11 and the second housing 13 are configured to install and carry the flexible screen 14.

The flexible screen 14 has flexible and bendable performance. When the collapsible electronic device 10 in Embodiment 1 is in a folded state, the flexible screen 14 may be housed between the first housing 11 and the second housing 13, in other words, the collapsible electronic device 10 may be an electronic device with a screen folded inward. In another embodiment, when the collapsible electronic device 10 is in the folded state, the flexible screen 14 is located outside, and the first housing 11 and the second housing 13 are located inside, in other words, the collapsible electronic device 10 may be an electronic device with a screen folded outward.

Figure 3:
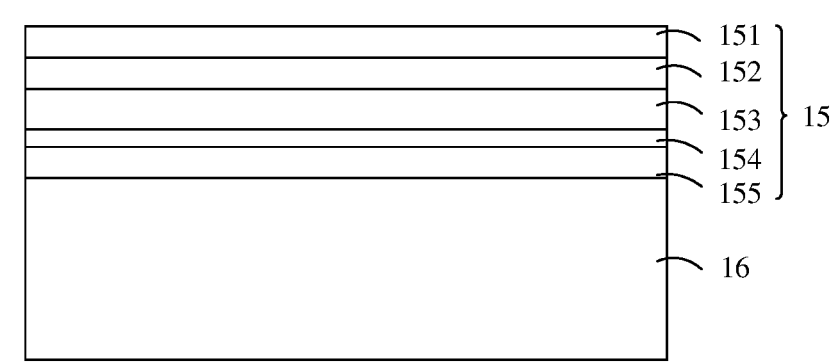
FIG. 3 is a schematic structural diagram of a side view layer of a flexible screen of a collapsible electronic device in FIG. 2.

As shown in FIG. 3, the flexible screen 14 may include a flexible screen cover 15 and a flexible display panel 16, and the flexible screen cover 15 covers the flexible display panel 16. The flexible screen cover 15 is configured to be touched by the user, and can protect the flexible display panel 16.

As shown in FIG. 3, in Embodiment 1, the flexible screen cover 15 may include a first protective layer 151, a second protective layer 152, a main layer 153, and a first buffer layer 155. The first protective layer 151, the second protective layer 152, the main layer 153, and the first buffer layer 155 are sequentially stacked, the first protective layer 151 is away from the flexible display panel 16, and the first buffer layer 155 is close to the flexible display panel 16.

The main layer 153 may be made of a high-modulus material, and therefore, has a relatively strong deformation resistance capability. For example, the main layer 153 may be made of ultra-thin glass (Ultra Glass, UTG for short) or a colorless polyimide (Colorless Polyimide, CPI for short). A modulus of the UTG is 60 GP to 90 GPa, a typical modulus value may be 60 GPa, 70 GPa, or 90 GPa, and the UTG has a quite strong deformation resistance capability. In addition, the UTG does not have a creep phenomenon (a phenomenon in which strain increases with time when stress of a solid material is constant), and after being bent, the UTG does not arch when being expanded again, so that a flatness requirement of the flexible screen cover 15 can be ensured. A modulus of the CPI is 5 GPa to 8 GPa, a typical modulus value may be 5 GPa, 6 GPa, or 8 GPa, and the CPI also has a relatively strong deformation resistance capability. In addition, the CPI has relatively good toughness, and an elongation at break (a proportion of an elongation length to a length before stretching when a material is stretched to break under a tensile force) of the CPI can reach 15% to 40%, and can be well adapted to a bending scenario. A thickness of the main layer 153 may be designed based on a requirement. For example, when the UTG is used, the thickness may be 30 μm to 100 μm, and a typical thickness value may be 30 μm, 70 μm, or 100 μm; when the CPI is used, the thickness may be 20 μm to 80 μm, and a typical thickness value may be 20 μm, 50 μm, 80 μm, or 100 μm.

Both the first protective layer 151 and the second protective layer 152 are configured to protect the main layer 153. Both the first protective layer 151 and the second protective layer 152 may be made of organic polymer materials, and are flexible and bending-resistant. The second protective layer 152 includes but is not limited to a film layer made of the CPI, and a thickness may be designed based on a requirement, for example, 20 μm to 80 μm.

The first protective layer 151 may use an organic polymer material with a modulus at a GPa level, for example, an aramid (Aramid) with a modulus of 8 GPa to 12 GPa (a typical modulus value may be 8 GPa, 10 GPa, or 12 GPa) and a thickness of 15 μm to 40 μm (a typical thickness value may be 15 μm, 25 μm, or 40 μm), a CPI with a modulus of 5 GPa to 8 GPa (a typical modulus value may be 5 GPa, 6 GPa, or 8 GPa) and a thickness of 20 μm to 80 μm (a typical thickness value may be 20 μm, 50 μm, 80 μm, or 100 μm), or a polyethylene terephthalate (Polyethylene terephthalate, PET for short) with a modulus of 1 GPa to 5 GPa (a typical modulus value may be 1 GPa, 3 GPa, or 5 GPa) and a thickness of 30 μm to 100 μm (a typical thickness value may be 30 μm, 50 μm, or 100 μm). Based on an actual requirement, the first protective layer 151 may be one film layer or at least two laminated film layers made of a single material, or may be at least two laminated film layers made of different materials (each film layer is made of a single material). The first protective layer 151 has a relatively high modulus, and has a relatively strong deformation resistance capability. Adding the first protective layer 151 above the second protective layer 152 can increase a thickness of a protective layer.

In another embodiment, to improve abrasion resistance and hardness of the first protective layer 151 and improve touch feedback of the user (so that touch of the user is relatively hard rather than soft), a hardening layer may be formed, through a hardening process, on a surface of the first protective layer 151 that is away from the second protective layer 152; and/or the flexible screen cover 15 may have only one protective layer, and material performance of the single protective layer may be determined based on a requirement, which is not limited to the foregoing description.

In an actual application scenario (for example, during an impact resistance test such as a pen drop test, a ball drop test, or an entire-device drop test), impact on the flexible screen cover 15 is transient impact, and transient stress is generated inside the flexible screen cover 15 when the flexible screen cover 15 is subjected to the transient impact. Because the first protective layer 151 is added to thicken and strengthen the protective layer above the flexible screen cover 15, the protective layer can resist transient stress, so that the protective layer is prevented from being pierced and the main layer 153 is prevented from being damaged. For example, it is verified through the impact resistance test that the main layer 153 made of the UTG is not fragile after the first protective layer 151 is added to the main layer 153. Therefore, impact resistance performance of the flexible screen cover 15 is improved. Because the impact resistance performance of the flexible screen cover 15 is improved, impact resistance performance of the entire flexible screen 14 can be improved.

Figure 4:
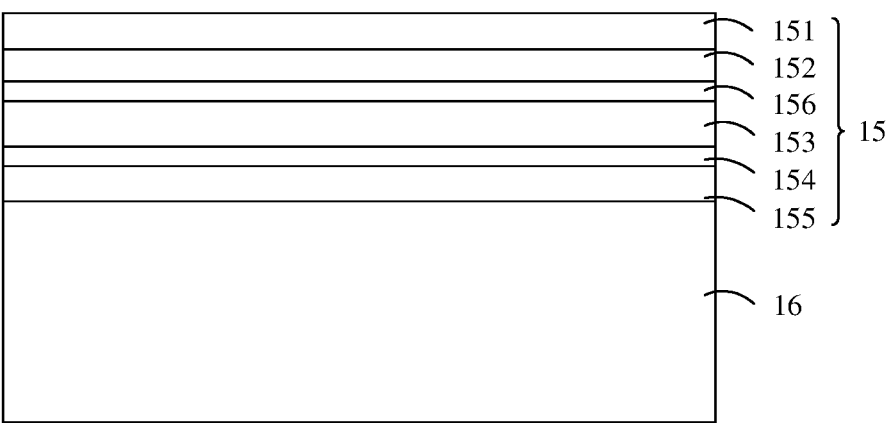
FIG. 4 is a schematic structural diagram of another side view layer of a flexible screen of the collapsible electronic device in FIG. 2.

As shown in FIG. 4, in particular, when the main layer 153 is a UTG film layer, considering that the UTG is fragile, a reinforcing layer 156 may cover the main layer 153, and the reinforcing layer 156 is sandwiched between the second protective layer 152 and the main layer 153. The reinforcing layer 156 may be made of, for example, a polymer material such as an acrylate, a polyurethane, a polyester, a polyimide, or an epoxy resin, and a material modulus of the reinforcing layer 156 is at least 1 MPa (the higher, the better). Disposing the reinforcing layer 156 can improve strength of the main layer 153 and reduce a breakage risk of the main layer 153, so that impact resistance performance of the flexible screen cover 15 and the entire flexible screen 14 can be improved. In addition, it is verified through the impact resistance test that when the reinforcing layer 156 is in direct contact with the main layer 153 (in other words, the reinforcing layer 156 and the main layer 153 are not bonded by using an additionally disposed adhesive, for example, the reinforcing layer 156 may be directly formed on a surface of the main layer 153 through a coating process; or the reinforcing layer 156 is an adhesive film for directly pasting the reinforcing layer 156 and the main layer 153), an effect of protecting the main layer 153 is optimal, and a breakage risk of the main layer 153 is the lowest. Certainly, the reinforcing layer 156 and the main layer 153 may be alternatively bonded by using an additional adhesive.

In another embodiment, the reinforcing layer 156 may be alternatively applied to the flexible screen cover 15 whose main layer 153 is a CPI film layer. Alternatively, the design of the reinforcing layer 156 may be cancelled.

The first buffer layer 155 may be made of a low-modulus translucent material (a modulus may be 500 KPa to 1 GPa, and a typical modulus value may be 500 KPa, 10 MPa, 100 MPa, or 1 GPa), for example, a polyurethane elastomer, an acrylate elastomer, or a polysiloxane elastomer. As shown in FIG. 3 or FIG. 4, the first buffer layer 155 and the main layer 153 may be bonded by using an adhesive layer 154, and the adhesive layer 154 may be, for example, an optically clear adhesive (Optically Clear Adhesive, OCA for short) or a pressure sensitive adhesive (Pressure Sensitive Adhesive, PSA for short).

Figure 5:
FIG. 5 is a schematic structural diagram of another side view layer of the flexible screen of the collapsible electronic device in FIG. 2.
Figure 5:
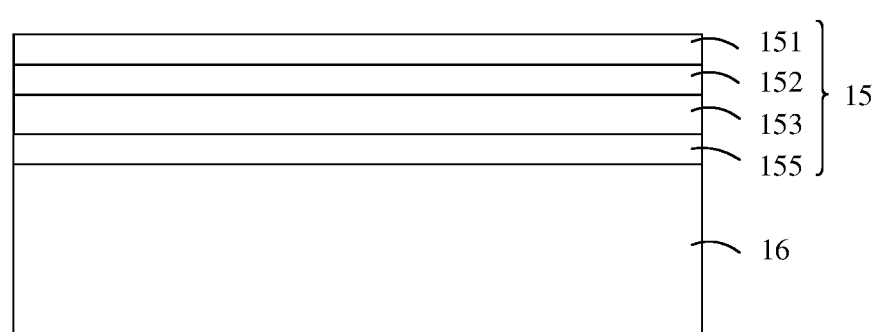
Figure 6:
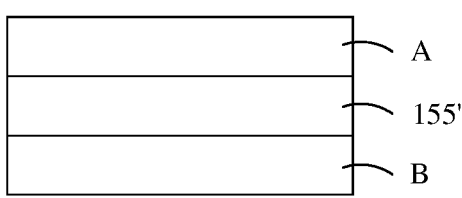
FIG. 6 is a schematic structural diagram of a side view layer of a buffer film used to produce a first buffer layer of the flexible screen in FIG. 5.

Alternatively, as shown in FIG. 5, the first buffer layer 155 may be in direct contact with the main layer 153. For example, the first buffer layer 155 may be formed on a surface of the main layer 153 through a coating process such as spraying or screen printing, or attachment of the first buffer layer 155 to the main layer 153 may be implemented in a manner of first laminating and then curing. Specifically, as shown in FIG. 6, a buffer film (a curing rate may be less than 70%) may be first produced from a buffer material, and the buffer film includes a heavy release film A, a non-completely cured buffer adhesive 155', and a light release film B that are sequentially stacked. Before lamination, the light release film B in the buffer film is torn off, and the non-completely cured buffer adhesive 155' is laminated to the surface of the main layer 153 through a lamination process (for example, roll lamination or vacuum lamination). Then a chemical group in the non-completely cured buffer adhesive 155' is completely reacted through a heating or ultraviolet light curing process, so that the first buffer layer 155 is formed on the surface of the main layer 153. When the first buffer layer 155 and the flexible display panel 16 are subsequently laminated, the heavy release film A on a surface of the first buffer layer 155 is torn off.

As described above, the flexible screen cover 15 is subjected to transient impact, and a mechanical scenario of the flexible screen cover 15 may be analyzed by using a stress wave theory in dynamic mechanics.

When external impact load is applied to a medium, medium particles directly subjected to the impact load first leave an initial equilibrium position. Because a relative movement (deformation) occurs between these medium particles and adjacent medium particles, these medium particles are subjected to an action force (namely, stress) provided by the adjacent medium particles, but also provide a reaction force to the adjacent medium particles. Therefore, the adjacent medium particles also leave an initial equilibrium position and move. Therefore, disturbance to the medium that is caused by the external impact load gradually propagates from near to far in the medium to form a stress wave.

Figure 7:
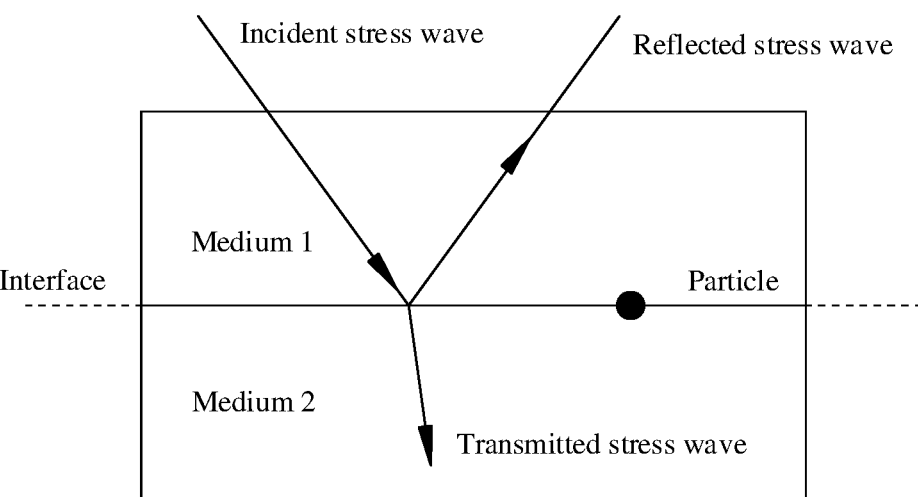
FIG. 7 is a schematic diagram of a principle of a stress wave theory.

As shown in FIG. 7, according to the stress wave theory, the stress wave is reflected and transmitted in an interface between two media with different wave impedance, energy of a reflected stress wave does not enter a next medium, and energy of a transmitted stress wave continues to be transmitted to the next medium through the interface. The energy of the reflected stress wave accumulates with time. On the premise that total energy of the stress wave is fixed, if the energy of the reflected stress wave increases, the energy of the transmitted wave decreases. A larger wave impedance difference between media on two sides of an interface indicates larger energy of a reflected stress wave in the interface and smaller energy of a transmitted stress wave in the interface. When the stress wave enters a medium 2 with small wave impedance from a medium 1 with large wave impedance, a velocity of a particle in an interface increases compared with a velocity of a particle adjacent to the interface in the medium 1, and therefore generation of strain on the particle in the interface is accelerated. Further, generation of strain on particles adjacent to the interface in the medium 1 and the medium 2 is also accordingly accelerated, in other words, generation of strain on the medium 1 and the medium 2 is accelerated. In addition, if a wave impedance difference between the two media is relatively large, strain generated by the medium 1 is relatively large. On the contrary, if a wave impedance difference between the two media is relatively small, strain generated by the medium 1 is relatively small. In addition, wave impedance of a medium is $Z=\sqrt{E\rho}$, where E is a modulus of a material, and $\rho$ is density of the material. To be specific, a higher modulus of a material (a material with a higher modulus usually also has higher density) indicates larger wave impedance.

With reference to the stress wave theory, the following continues to describe Embodiment 1 in detail separately for a solution in which the main layer 153 and the first buffer layer 155 are bonded by using an adhesive and a solution in which the main layer 153 is in direct contact with the first buffer layer 155.

Figure 8:
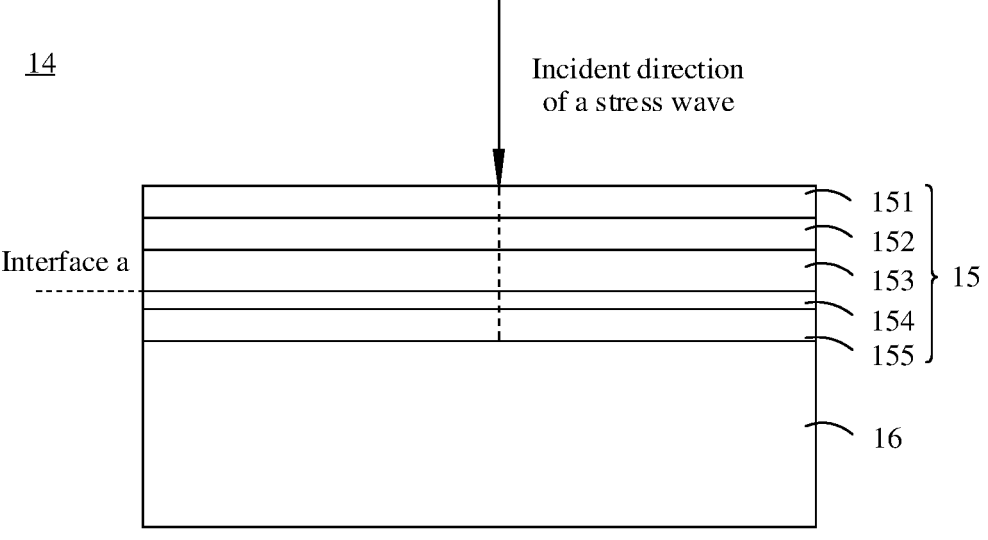
FIG. 8 is a schematic diagram of a mechanical scenario in which a flexible screen cover of the flexible screen in FIG. 3 is impacted by a stress wave.

(1) Solution in which the Main Layer 153 and the First Buffer Layer 155 are Bonded by Using the Adhesive Compared with the main layer 153, the adhesive is a highly deformable material (similar to adhesive glue) with an extremely low modulus (usually less than 100 KPa, where for example, a modulus of the OCA may be 30 KPa), and a modulus ratio (a ratio of moduli) of the main layer 153 to the adhesive layer is extremely high (for example, greater than or equal to 1800000), in other words, a wave impedance difference between the two is extremely large. Due to a product thickness requirement, a thickness of the adhesive layer is quite small (for example, 25 μm or 50 μm). As shown in FIG. 8, the stress wave enters the flexible screen cover 15 from the protective layer, and propagates to an interface a between the main layer 153 and the adhesive layer 154. According to the stress wave theory, the stress wave may be reflected and transmitted in the interface a, and generation of strain on the main layer 153 and the adhesive layer 154 is accelerated. Because the adhesive layer 154 is highly deformable and has a quite small thickness, the adhesive layer 154 is almost "extruded" by the main layer 153 in a quite short time (in this case, the main layer 153 is in approximately direct contact with the first buffer layer 155), so that the interface a is "damaged" in a quite short time. Consequently, the stress wave cannot be adequately reflected by the interface between the main layer 153 and the adhesive layer 154, and a transmitted stress wave carries much energy and continues to be conducted downward. In other words, the adhesive layer 154 hardly affects energy of a reflected stress wave under the foregoing thickness limitation.

When the stress wave continues to be conducted to the first buffer layer 155, because the main layer 153 is in approximately direct contact with the first buffer layer 155, it may be considered that an interface is formed between the main layer 153 and the first buffer layer 155. A modulus ratio of the main layer 153 to the first buffer layer 155 may be 8 to 180000, and a typical modulus ratio may be 8, 600, or 180000. For example, a modulus ratio of the main layer 153 of the UTG material to the first buffer layer 155 may be 60 to 180000, and a typical modulus ratio may be 60, 700, 7000, or 180000; a modulus ratio of the main layer 153 of the CPI material to the first buffer layer 155 may be 8 to 16000, and a typical modulus ratio may be 8, 60, 600, or 16000. It can be learned that the modulus ratio of the main layer 153 to the first buffer layer 155 and a wave impedance difference between the two are relatively large, but are smaller than the modulus ratio of the main layer 153 to the adhesive layer 154 and the wave impedance difference between the two.

According to the stress wave theory, the stress wave may be reflected and transmitted in the interface between the main layer 153 and the first buffer layer 155, and strain occurs on the main layer 153 and the first buffer layer 155. Because the modulus (500 KPa to 1 GPa) of the first buffer layer 155 is far greater than the modulus (less than 100 KPa) of the adhesive layer 154, the first buffer layer 155 is less prone to deformation than the adhesive layer 154, so that the interface between the main layer 153 and the first buffer layer 155 can exist more stably. In this way, the stress wave can be relatively adequately reflected by the interface between the main layer 153 and the first buffer layer 155, so that energy of a transmitted stress wave is relatively small, and energy received by the flexible display panel 16 below the first buffer layer is also relatively small.

It can be learned that the flexible screen cover 15 for which the first buffer layer 155 is disposed can attenuate stress wave energy, reduce impact on the flexible display panel 16, and effectively reduce a risk of damage to the flexible display panel 16. This improves impact resistance capabilities of the flexible screen cover 15 and the entire flexible screen 14.

(2) Solution in which the Main Layer 153 is in Direct Contact with the First Buffer Layer 155

Figure 9:
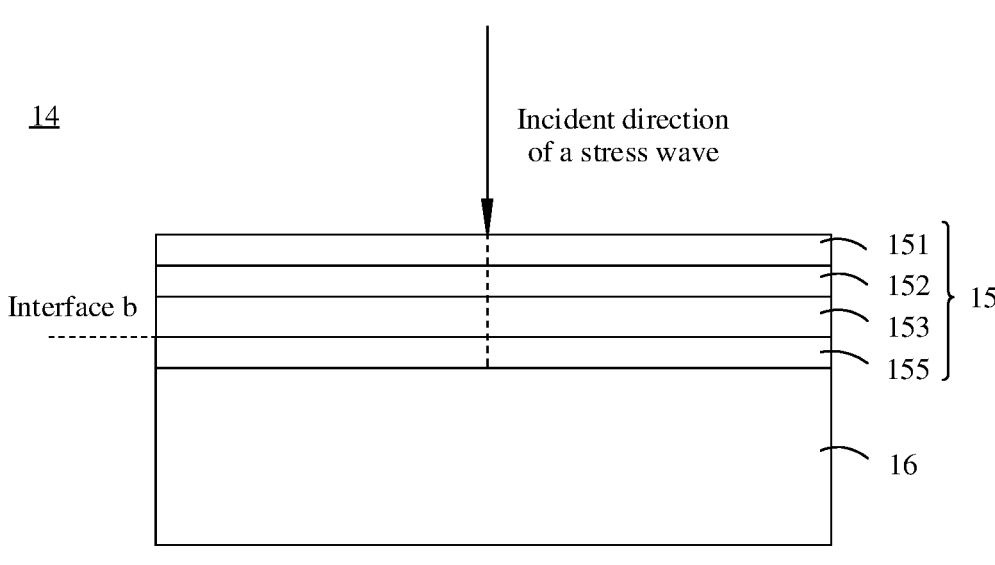
FIG. 9 is a schematic diagram of a mechanical scenario in which a flexible screen cover of the flexible screen in FIG. 5 is impacted by a stress wave.

As shown in FIG. 9, in solution (2), no adhesive layer is disposed, and an interface b is directly formed between the main layer 153 and the first buffer layer 155. A principle analysis of solution (2) is consistent with that when the stress wave is conducted to the first buffer layer 155 in solution (1). Therefore, solution (2) can also improve impact resistance capabilities of the flexible screen cover 15 and the entire flexible screen 14.

In addition, in solution (1), the modulus ratio (greater than or equal to 1800000) of the main layer 153 to the adhesive layer 154 is extremely large, and therefore deformation of the main layer 153 is relatively large. In solution (2), the modulus ratio (8 to 180000) of the main layer 153 to the first buffer layer 155 is relatively small, and therefore deformation of the main layer 153 is relatively small. Strain reduction of the main layer 153 can prevent damage to the main layer 153 that is caused by excessive deformation. In particular, for the main layer 153 made of the fragile UTG, using the solution in which the UTG is in direct contact with the first buffer layer 155 can avoid excessive deformation of the UTG and reduce a breakage risk of the UTG. Certainly, for the main layer 153 made of the non-fragile CPI, using the solution in which the CPI is in direct contact with the first buffer layer 155 can also avoid excessive deformation of the CPI. This is also an improvement to impact resistance capabilities of the flexible screen cover 15 and the entire flexible screen 14.

In conclusion, in Embodiment 1, disposing the first buffer layer 155 below the main layer 153 and ensuring that the modulus ratio of the main layer 153 to the first buffer layer 155 falls within a proper range can reduce deformation of the flexible screen cover 15, improve self-protection performance and reliability of the flexible screen cover 15, and improve an impact resistance capability of the flexible screen 14.

In Embodiment 1, an elongation rate at break (an elongation rate at break) of materials of the first buffer layer 155 to the main layer 153 may be greater than or equal to 2, and a typical value may be 25. For example, an elongation rate at break of the first buffer layer 155 to the main layer 153 of the UTG material may be greater than or equal to 10, and a typical value may be 10, 40, or 100; an elongation rate at break of the first buffer layer 155 to the main layer 153 of the CPI material may be greater than or equal to 2, and a typical value may be 2, 16, or 25. This indicates that the first buffer layer 155 is tougher and less fragile than the main layer 153. When the main layer 153 is impacted, the first buffer layer 155 can provide resistance to the main layer 153 to resist deformation of the main layer 153, thereby reducing a risk of damage to the main layer 153 and improving impact resistance performance of the flexible screen cover 15 and the entire flexible screen 14. In particular, for the main layer 153 made of the fragile UTG, disposing the tougher first buffer layer 155 can greatly reduce a breakage risk of the UTG.

It may be understood that the design of the elongation rate at break is independent of the foregoing design of the modulus ratio of the main layer 153 to the first buffer layer 155, and an impact resistance capability of the flexible screen 14 can be improved regardless of whether either design or both designs are used.

Figure 10:
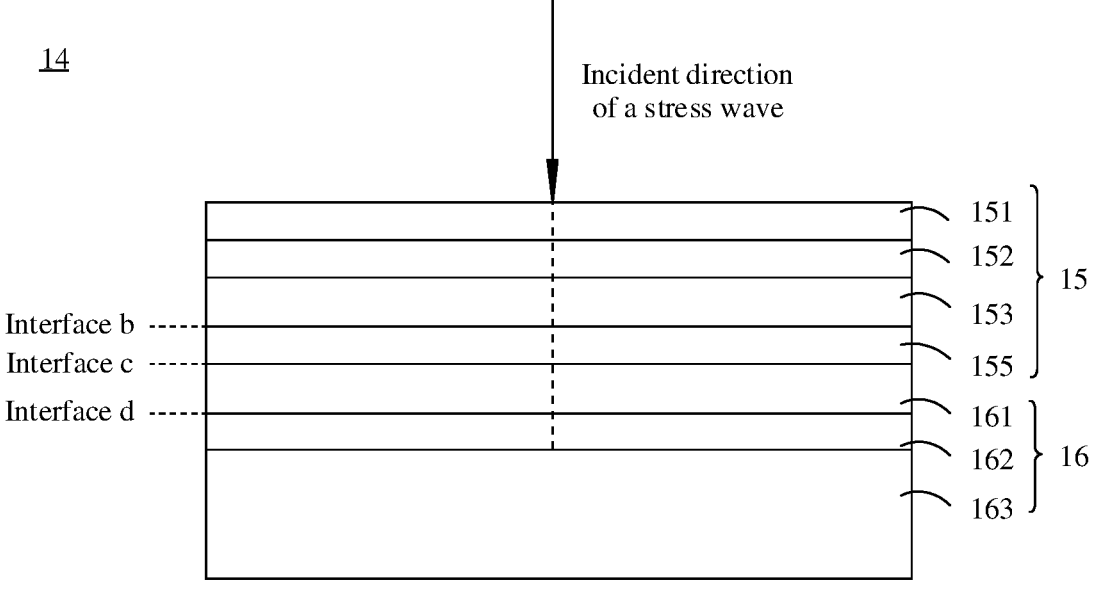
FIG. 10 is a schematic diagram of a mechanical scenario in which a flexible display panel of the flexible screen in FIG. 5 is impacted by a stress wave.

As shown in FIG. 10, in Embodiment 1, the flexible display panel 16 may be a flexible organic light-emitting diode (Organic Light-Emitting Diode, OLED for short) display panel. The flexible display panel 16 may include a polarizer 161, a second buffer layer 162, and a display layer 163 that are sequentially stacked.

The display layer 163 may include an OLED component, and can emit light under an electric field to implement display. A side on which the display layer 163 can emit light is referred to as a light emitting side (for example, an upper side in FIG. 10); a side that is opposite to the light emitting side does not emit light, and may be referred to as a backlight side (for example, a lower side in FIG. 10). The polarizer 161 is located on the light emitting side of the display layer 163, and is located between the first buffer layer 155 and the display layer 163. A modulus of the polarizer 161 may be 2 GPa to 5 GPa, and a typical value may be 2 GPa, 3.5 GPa, or 5 GPa. A modulus ratio of the polarizer 161 to the first buffer layer 155 may be 4 to 10000, for example, 4, 350, or 10000. This indicates that a modulus difference between the polarizer 161 and the first buffer layer 155 is relatively large, and therefore a wave impedance difference is also relatively large.

A material type and a material parameter of the second buffer layer 162 may be the same as those of the first buffer layer 155. For example, the second buffer layer 162 may also be made of a low-modulus (a modulus may be 500 KPa to 1 GPa) translucent material that is prone to deformation, for example, a polyurethane elastomer, an acrylate elastomer, or a polysiloxane elastomer. A modulus ratio of the polarizer 161 to the second buffer layer 162 may be 4 to 10000, for example, 4, 350, or 10000. This indicates that a modulus difference between the polarizer 161 and the second buffer layer 162 is relatively large, and a wave impedance difference between the two is also relatively large. The second buffer layer 162 may be in direct contact with the polarizer 161. For example, the second buffer layer 162 may be formed on a surface of the polarizer 161 through a coating process such as spraying or screen printing, or attachment of the second buffer layer 162 to the main layer 153 may be implemented in a manner of first laminating and then curing (which is similar to the foregoing description, and details are not repeated herein). The second buffer layer 162 and the polarizer 161 may be bonded by using an adhesive, and the adhesive may be, for example, an OCA or a PSA.

It can be obtained through analysis using the foregoing stress wave theory that, because the wave impedance differences between the polarizer 161 and the first buffer layer 155 and the second buffer layer 162 on both sides of the polarizer 161 are relatively large and fall within a proper range, energy of the stress wave attenuated in the interface b between the main layer 153 and the first buffer layer 155 is attenuated in an interface c between the first buffer layer 155 and the polarizer 161 and is further attenuated in an interface d between the polarizer 161 and the second buffer layer 162, so that energy finally entering the display layer 163 is greatly reduced, thereby effectively reducing a risk of damage to the display layer 163 and avoiding abnormal display. In addition, it can be also obtained through analysis that the solution in which the polarizer 161 is in direct contact with the second buffer layer 162 can avoid excessive deformation of the polarizer 161 and reduce a risk of damage to the polarizer 161.

Therefore, disposing one buffer layer on an upper side and a lower side of the polarizer 161 and ensuring that a modulus ratio of the polarizer 161 to the buffer layer falls within a proper range can improve impact resistance capabilities of the flexible display panel 16 and the flexible screen 14. For example, it is verified through a pen drop impact test that, after the solution of Embodiment 1 is used, a corresponding pen drop height when a colored spot (a tiny fine bright point that occurs in a display area) is generated on the flexible display panel 16 is greatly improved, which means that impact resistance performance of the flexible display panel 16 is greatly improved.

In the foregoing description, the first buffer layer 155 is used as a component of the flexible screen cover 15. Certainly, the first buffer layer 155 may alternatively belong to the flexible display panel 16. Because the flexible screen cover 15 and the flexible display panel 16 are finally assembled into the flexible screen 14, the solution of Embodiment 1 can effectively improve impact resistance performance of the flexible screen 14 in either manner.

Because a back surface of the flexible display panel 16 corresponds to the housing and the hinge, the back surface of the flexible display panel 16 is subjected to impact of these structures, and therefore a buffer layer may be further disposed on the backlight side of the display layer 163. The following provides detailed description.

Figure 11:
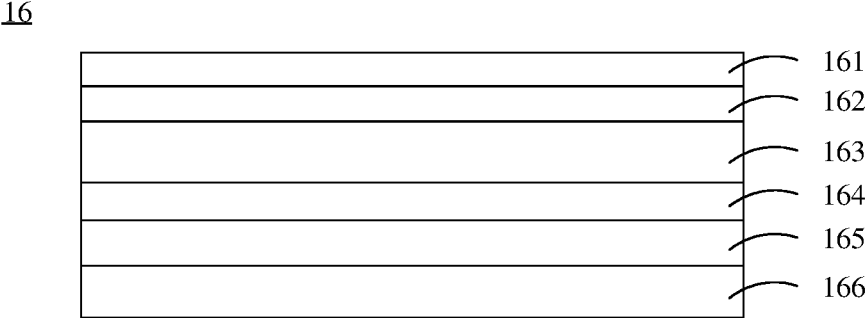
FIG. 11 is a schematic structural diagram of a side view layer of a flexible display panel according to Embodiment 2.

As shown in FIG. 11, in Embodiment 2, based on the foregoing solution of Embodiment 1, a back film 164, a third buffer layer 165, and a support layer 166 are sequentially stacked on the backlight side of the display layer 163.

The back film 164 has a function of supporting and protecting the display layer 163. A thickness of the back film 164 may be 20 μm to 100 μm, and a modulus may be 1 GPa to 10 GPa.

The third buffer layer 165 may be made of a material such as a polyurethane elastomer, an acrylate elastomer, a polysiloxane elastomer, an acrylate foam, a polyurethane foam, polystyrene, polyethylene material, an ethylene propylene terpolymer, or an ethylene vinyl acetate copolymer. The third buffer layer 165 is disposed on the backlight side of the display layer 163, and therefore may be made of a translucent or non-translucent material. A thickness of the third buffer layer 165 may be 10 μm to 300 μm. The third buffer layer 165 has a low modulus such as 500 KPa to 1 GPa, and is prone to deformation. A modulus ratio of the back film 164 to the third buffer layer 165 may be 2 to 20000, and a typical modulus ratio may be 2, 500, or 20000. This indicates that a modulus difference and a wave impedance difference between the back film 164 and the third buffer layer 165 are relatively large.

The support layer 166 is used as a back support and protection structure of the entire flexible display panel 16. A thickness of the support layer 166 may be 20 μm to 200 μm. The support layer 166 may be made of a metal material such as a titanium alloy (a modulus may be 50 GPa to 150 GPa), stainless steel (a modulus may be 150 GPa to 250 GPa), copper foil, or a magnesium aluminum alloy (a modulus may fall between 30 GPa to 100 GPa). Alternatively, the support layer 166 may be made of a high-modulus organic material such as a CPI, an aramid, or a PET. A modulus ratio of the support layer 166 to the third buffer layer 165 may be 2 to 500000, and a typical value may be 2, 2000, or 500000. It can be learned that a modulus difference and a wave impedance difference between the support layer 166 and the third buffer layer 165 are relatively large.

It can also be obtained through analysis by using the foregoing stress wave theory that, because the third buffer layer 165 with a relatively low modulus is disposed between the back film 164 and the support layer 166, and it is ensured that the modulus ratios of the back film 164 to the third buffer layer 165 and the support layer 166 to the third buffer layer 165 fall within proper ranges, two interfaces between a high-modulus material and a low-modulus material can be constructed, so that energy of the stress wave from the back surface of the flexible display panel 16 is attenuated twice, and energy finally entering the display layer 163 is greatly reduced, thereby greatly reducing impact on the display layer 163 and effectively alleviating impact on the flexible display panel 16 that is caused by the housing and the hinge.

In a further embodiment, a buffer layer may be further added on the backlight side of the display layer 163, to add an interface between a high-modulus material and a low-modulus material, increase attenuation of stress wave energy, and further reduce impact on the display layer 163.

Figure 12:
FIG. 12 is a schematic structural diagram of a side view layer of a flexible display panel according to Embodiment 3.

As shown in FIG. 12, in Embodiment 3, one third buffer layer 165 is disposed on an upper side and a lower side of the support layer 166, in other words, two third buffer layers 165 and the support layer 166 are alternately stacked, and an outer third buffer layer 165 is used as a layer farthest from the display layer 163.

Figure 13:
FIG. 13 is a schematic structural diagram of a side view layer of a flexible display panel according to Embodiment 4.

Alternatively, as shown in FIG. 13, in Embodiment 4, two third buffer layers 165 and two support layers 166 are disposed on the backlight side of the display layer 163, the two third buffer layers 165 and the two support layers 166 are alternately stacked, and an outer support layer 166 is used as a layer farthest from the display layer 163.

Figure 14:
FIG. 14 is a schematic structural diagram of a side view layer of a flexible display panel according to Embodiment 5.

Alternatively, as shown in FIG. 14, in Embodiment 5, three third buffer layers 165 and two support layers 166 are disposed on the backlight side of the display layer 163, the three third buffer layers 165 and the two support layers 166 are alternately stacked, and an outer third buffer layer 165 is used as a layer farthest from the display layer 163.

It may be understood that in another embodiment, an alternately stacked structure of another quantity of third buffer layers 165 and another quantity of support layers 166 may be designed based on a requirement, and is not limited to the foregoing description.

It may be understood that in another embodiment, provided that an interface between a high-modulus material and a low-modulus material is constructed by disposing a buffer layer at any proper position in the flexible screen 14 and enabling a modulus ratio of an adjacent layer (a layer adjacent to the buffer layer, including the display layer and excluding the adhesive layer) to the buffer layer to fall within a proper range (for example, 2 to 500000), impact resistance performance of the entire flexible screen 14 can be improved.

Figure 15:
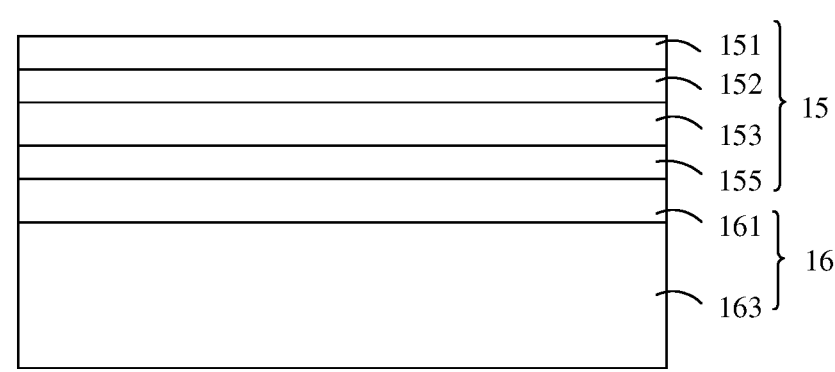
FIG. 15 is a schematic structural diagram of a side view layer of a flexible screen according to another embodiment.
Figure 16:
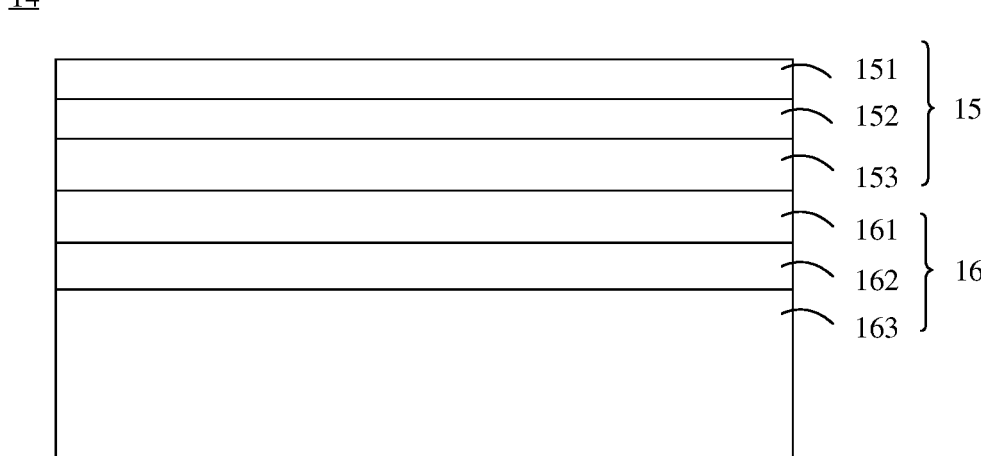
FIG. 16 is a schematic structural diagram of another side view layer of a flexible screen according to another embodiment.
Figure 17:
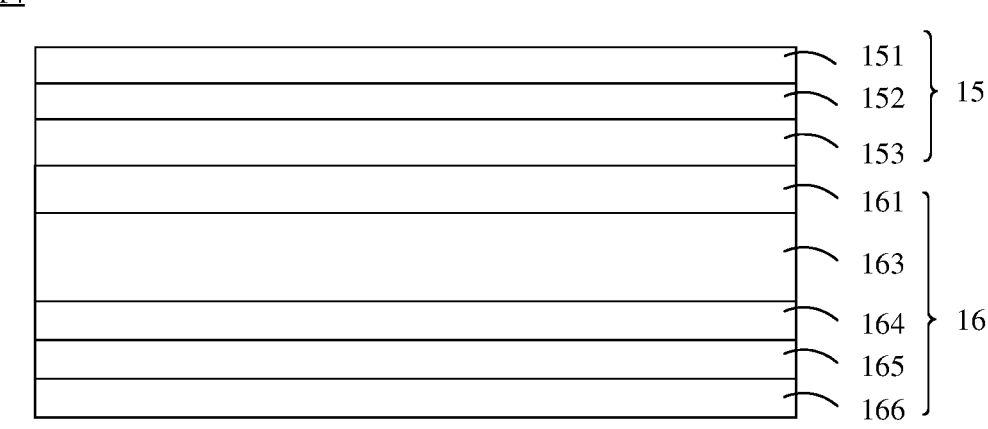
FIG. 17 is a schematic structural diagram of another side view layer of a flexible screen according to another embodiment.

For example, as shown in FIG. 15, only one buffer layer 155 (namely, the first buffer layer 155) may be disposed between the main layer 153 of the flexible screen cover 15 and the polarizer 161 of the flexible display panel 16, so that a modulus ratio of the main layer 153 to the buffer layer 155 is 8 to 180000. Alternatively, as shown in FIG. 16, only one buffer layer 162 (namely, the second buffer layer 162) may be disposed between the polarizer 161 and the display layer 163 of the flexible display panel 16, so that a modulus ratio of the polarizer 161 to the buffer layer 162 is 4 to 10000, and a modulus ratio of the display layer 163 to the buffer layer 162 is 2 to 500000. Alternatively, as shown in FIG. 17, only one buffer layer 165 (namely, the third buffer layer 165) may be disposed between the back film 164 and the support layer 166 of the flexible display panel 16, so that a modulus ratio of the back film 164 to the buffer layer is 2 to 20000, and a modulus ratio of the support layer 166 to the third buffer layer 165 is 2 to 500000.

It can be learned from the foregoing description that regardless of whether the flexible screen cover has a buffer layer or the flexible display panel has a buffer layer, impact resistance performance of the flexible screen into which the flexible screen cover and the flexible display panel are assembled can be improved. In other words, both collocation of a flexible screen cover with a buffer layer and a conventional flexible display panel and collocation of a conventional flexible screen cover and a flexible display panel with a buffer layer can improve impact resistance performance of the flexible screen.

In the foregoing embodiments of this application, any two adjacent layers of the flexible screen 14 may be bonded by using an adhesive or in direct contact based on a product requirement, which is not emphasized in other places except specifically stated.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A flexible screen cover, comprising:
a protective layer, a main layer, and a buffer layer that are sequentially stacked, wherein a ratio of a modulus of elasticity of the main layer to a modulus of elasticity of the buffer layer is from 8 to 180000; and
an adhesive layer between, and in direct contact with, the main layer and the buffer layer, wherein the adhesive layer has a modulus of elasticity that is less than, or equal to, 100 kilopascals (Kpa), wherein the ratio of the modulus of elasticity of the main layer to the modulus of elasticity of the buffer layer is smaller than a ratio of the modulus of elasticity of the main layer to a modulus of elasticity of the adhesive layer, and wherein a difference between a wave impedance of the main layer and the wave impedance of the buffer layer is smaller than a difference between the wave impedance of the main layer and the wave impedance of the adhesive layer;
wherein an elongation rate at break of the buffer layer to the main layer is greater than or equal to 2.

2. The flexible screen cover according to claim 1, wherein the buffer layer is in direct contact with the main layer.

3. The flexible screen cover according to claim 1, wherein the main layer is made of ultra-thin glass, the flexible screen cover comprises a reinforcing layer, the reinforcing layer and the main layer are stacked between the protective layer and the main layer, and a modulus of elasticity of the reinforcing layer is greater than or equal to 1 megapascal (MPa).

4. The flexible screen cover according to claim 1, wherein the main layer is made of a colorless polyimide, and the ratio of the modulus of elasticity of the main layer to the modulus of elasticity of the buffer layer is from 8 to 16000.

5. The flexible screen cover according to claim 1, wherein the buffer layer is made of a polyurethane elastomer, an acrylate elastomer, or a polysiloxane elastomer.

6. The flexible screen cover according to claim 1, wherein the protective layer comprises a first protective layer and a second protective layer that are stacked, the second protective layer is located between the first protective layer and the main layer, and a modulus of elasticity of the first protective layer is between 1 gigapascal (GPa) and 1000 GPa.

7. A flexible display panel, comprising:
a main layer, a first buffer layer, a polarizer, a second buffer layer, and a display layer that are sequentially stacked, wherein the polarizer is located on a light emitting side of the display layer, wherein a ratio of a modulus of elasticity of the polarizer to a modulus of elasticity of the first buffer layer is from 4 to 10000, wherein a ratio of the modulus of elasticity of the polarizer to a modulus of elasticity of the second buffer layer is from 4 to 10000, wherein the first buffer layer and the second buffer layer are each formed of an elastomer material;
wherein an elongation rate at break of the first buffer layer to the main layer is greater than or equal to 2.

8. The flexible display panel according to claim 7, wherein
the polarizer is in direct contact with the second buffer layer.

9. The flexible display panel according to claim 7, wherein the first buffer layer is made of a polyurethane elastomer, an acrylate elastomer, or a polysiloxane elastomer; and wherein the second buffer layer is made of a polyurethane elastomer, an acrylate elastomer, or a polysiloxane elastomer.

10. The flexible display panel according to claim 7, wherein the flexible display panel comprises a third buffer layer and a support layer, wherein the third buffer layer, the support layer, and the display layer are stacked and are all located on a backlight side of the display layer, and wherein a ratio of a modulus of elasticity of the support layer to a modulus of elasticity of the third buffer layer is from 2 to 500000.

11. The flexible display panel according to claim 10, wherein there is at least one support layer, there are at least two third buffer layers, the at least one support layer and the at least two third buffer layers are alternately stacked, one of the third buffer layers is adjacent to the display layer, and the display layer and all support layers are respectively located on two opposite sides of the third buffer layer adjacent to the display layer.

12. The flexible display panel according to claim 10, wherein the third buffer layer is made of a polyurethane elastomer, an acrylate elastomer, a polysiloxane elastomer, an acrylate foam, a polyurethane foam, a polystyrene material, a polyethylene material, an ethylene propylene terpolymer material, or an ethylene vinyl acetate copolymer material.

13. A flexible screen, comprising:

a protective layer, a main layer, a polarizer, a display layer, and a support layer that are sequentially stacked, wherein the polarizer is located on a light emitting side of the display layer, wherein the support layer is located on a backlight side of the display layer, and wherein the flexible screen further comprises at least one of a first buffer layer, a second buffer layer, or a third buffer layer; and wherein the first buffer layer is formed of an elastomer material and is located between the main layer and the polarizer, wherein a ratio of a modulus of elasticity of the main layer to a modulus of elasticity of the first buffer layer is from 2 to 500000, and wherein a ratio of a modulus of elasticity of the polarizer to the modulus of elasticity of the first buffer layer is from 2 to 500000;

wherein the second buffer layer is formed of an elastomer material and is located between the polarizer and the display layer, and a ratio of the modulus of elasticity of the polarizer to a modulus of elasticity of the second buffer layer is from 2 to 500000, and wherein a ratio of a modulus of elasticity of the display layer to the modulus of elasticity of the second buffer layer is from 2 to 500000;

wherein the third buffer layer is formed of an elastomer material, an acrylate foam, a polyurethane foam, a polystyrene material, a polyethylene material, an ethylene propylene terpolymer material, or an ethylene vinyl acetate copolymer material, and is located on the backlight side of the display layer, wherein the third buffer layer and the support layer are stacked, and wherein a ratio of a modulus of elasticity of the support layer to a modulus of elasticity of the third buffer layer is from 2 to 500000; and wherein, based on the flexible screen comprising the first buffer layer, an elongation rate at break of the first buffer layer to the main layer is greater than or equal to 2.

14. The flexible screen according to claim 13, wherein, based on the flexible screen comprising the first buffer layer or the second buffer layer, at least one of:

the first buffer layer is made of a polyurethane elastomer, an acrylate elastomer, or a polysiloxane elastomer; and the second buffer layer is made of a polyurethane elastomer, an acrylate elastomer, or a polysiloxane elastomer; or based on the flexible screen comprising the third buffer layer, the third buffer layer is made of a polyurethane elastomer, an acrylate elastomer, a polysiloxane elastomer, an acrylate foam, a polyurethane foam, a polystyrene material, a polyethylene material, an ethylene propylene terpolymer material, or an ethylene vinyl acetate copolymer material.

15. A collapsible electronic device, comprising:

a housing; and a flexible screen wherein the flexible screen is installed in the housing;

wherein the flexible screen comprises:

a protective layer, a main layer, a polarizer, a display layer, and a support layer that are sequentially stacked, wherein the polarizer is located on a light emitting side of the display layer, wherein the support layer is located on a backlight side of the display layer, and wherein the flexible screen further comprises at least one of a first buffer layer, a second buffer layer, or a third buffer layer;

wherein the first buffer layer is formed of an elastomer material and is located between the main layer and the polarizer, wherein a ratio of a modulus of elasticity of the main layer to a modulus of elasticity of the first buffer layer is from 2 to 500000, and wherein a ratio of the modulus of elasticity of the polarizer to a modulus of elasticity of the first buffer layer is from 2 to 500000;

wherein the second buffer layer is formed of an elastomer material and is located between the polarizer and the display layer, and a ratio of a modulus of elasticity of the polarizer to a modulus of elasticity of the second buffer layer is from 2 to 500000, and wherein a ratio of a modulus of elasticity of the display layer to the modulus of elasticity of the second buffer layer is from 2 to 500000;

wherein the third buffer layer is formed of an elastomer material, an acrylate foam, a polyurethane foam, a polystyrene material, a polyethylene material, an ethylene propylene terpolymer material, or an ethylene vinyl acetate copolymer material, and is located on the backlight side of the display layer, wherein the third buffer layer and the support layer are stacked, and wherein a ratio of a modulus of elasticity of the support layer to a modulus of elasticity of the third buffer layer is from 2 to 500000; and wherein, based on the flexible screen comprising the first buffer layer, an elongation rate at break of the first buffer layer to the main layer is greater than or equal to 2.

16. The collapsible electronic device according to claim 15, wherein the main layer is made of ultra-thin glass, the flexible screen cover comprises a reinforcing layer, the reinforcing layer and the main layer are stacked between the protective layer and the main layer, and a modulus of elasticity of the reinforcing layer is greater than or equal to 1 megapascal (MPa).

17. The collapsible electronic device according to claim 15, wherein the main layer is made of a colorless polyimide.

18. The collapsible electronic device according to claim 15, wherein, based on the flexible screen comprising the first buffer layer or the second buffer layer, at least one of:

the first buffer layer is made of a polyurethane elastomer, an acrylate elastomer, or a polysiloxane elastomer; and the second buffer layer is made of a polyurethane elastomer, an acrylate elastomer, or a polysiloxane elastomer; or based on the flexible screen comprising the third buffer layer, the third buffer layer is made of a polyurethane elastomer, an acrylate elastomer, a polysiloxane elastomer, an acrylate foam, a polyurethane foam, a polystyrene material, a polyethylene material, an ethylene propylene terpolymer material, or an ethylene vinyl acetate copolymer material.

19. The collapsible electronic device according to claim 15, wherein the protective layer comprises a first protective layer and a second protective layer that are stacked, the second protective layer is located between the first protective layer and the main layer, and a modulus of elasticity of the first protective layer is between 1 gigapascal (GPa) and 1000 GPa.

* * * * *